US009888198B2

(12) United States Patent
Mauritzson et al.

(10) Patent No.: US 9,888,198 B2
(45) Date of Patent: Feb. 6, 2018

(54) IMAGING SYSTEMS HAVING IMAGE SENSOR PIXEL ARRAYS WITH SUB-PIXEL RESOLUTION CAPABILITIES

(71) Applicant: Semiconductor Components Industries, LLC, Phoenix, AZ (US)

(72) Inventors: Richard A. Mauritzson, Meridian, ID (US); Dennis Robert Engelbrecht, Philomath, OR (US); Robert A. Black, Milpitas, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 347 days.

(21) Appl. No.: 14/295,203

(22) Filed: Jun. 3, 2014

(65) Prior Publication Data

US 2015/0350583 A1    Dec. 3, 2015

(51) Int. Cl.
*H04N 5/378* (2011.01)
*H01L 27/146* (2006.01)
*H04N 5/374* (2011.01)
*H04N 9/04* (2006.01)
*H04N 5/3745* (2011.01)

(52) U.S. Cl.
CPC ....... *H04N 5/378* (2013.01); *H01L 27/14621* (2013.01); *H01L 27/14627* (2013.01); *H01L 27/14641* (2013.01); *H01L 27/14647* (2013.01); *H04N 5/374* (2013.01); *H04N 9/045* (2013.01); *H04N 5/37452* (2013.01); *H04N 5/37457* (2013.01)

(58) Field of Classification Search
CPC .. H04N 5/378; H04N 5/374; H01L 27/14621; H01L 27/14647; H01L 27/14627; H01L 27/14641

USPC ....... 250/208.1, 214 R, 214.1; 348/294–309; 257/290–294, 431, 432
See application file for complete search history.

(56) References Cited

U.S. PATENT DOCUMENTS 7,020,353 B1  3/2006  McCaffrey et al.
7,511,716 B2  3/2009  Berestov et al.
7,745,779 B2  6/2010  Conners
(Continued)

OTHER PUBLICATIONS

Korobov et al., U.S. Appl. No. 14/290,814, filed May 29, 2014.

*Primary Examiner* — Georgia Y Epps
*Assistant Examiner* — Don Williams
(74) *Attorney, Agent, or Firm* — Treyz Law Group, P.C.; Michael H. Lyons; David K. Cole

(57) ABSTRACT

An image sensor may include an array of photodiodes and readout circuitry. A group of adjacent photodiodes in the array may be covered with a first color filter element that transmits a first color light and an additional group of adjacent photodiodes may be covered with a second color filter element that transmits a second color light. The group of photodiodes may share a floating diffusion node. The array may be operable in a low resolution mode in which the readout circuitry reads out image signals corresponding to a sum of charges generated by the group of photodiodes and in a high resolution mode in which the readout circuitry reads out image signals corresponding to charges generated by each of the photodiodes from the shared floating diffusion node. The photodiodes in the group may capture charge using different integration times for generating high-dynamic-range images.

16 Claims, 10 Drawing Sheets

(56) References Cited

U.S. PATENT DOCUMENTS

| | | |
|---|---|---|
| 7,773,138 B2 | 8/2010 | Lahav et al. |
| 7,829,832 B2 | 11/2010 | Mauritzson et al. |
| 8,130,304 B2 | 3/2012 | Yin et al. |
| 8,179,463 B1 | 5/2012 | Geurts |
| 8,599,284 B2 | 12/2013 | Mo et al. |
| 8,610,186 B2 | 12/2013 | Tanaka |
| 8,730,330 B2 | 5/2014 | Solhusvik et al. |
| 8,730,545 B2 | 5/2014 | Endo et al. |
| 9,106,826 B2 | 8/2015 | Aoki |
| 2006/0125947 A1* | 6/2006 | Packer ............. H01L 27/14627 348/340 |
| 2008/0018662 A1 | 1/2008 | Gazeley |
| 2008/0043128 A1* | 2/2008 | Poonnen ............. H03M 1/123 348/294 |
| 2008/0259202 A1 | 10/2008 | Fujii |
| 2008/0274581 A1 | 11/2008 | Park |
| 2009/0096890 A1* | 4/2009 | Li ..................... H04N 3/155 348/229.1 |
| 2009/0108176 A1 | 4/2009 | Blanquart |
| 2009/0230394 A1 | 9/2009 | Nagaraja et al. |
| 2011/0025904 A1 | 2/2011 | Onuki et al. |
| 2012/0002089 A1 | 1/2012 | Wang et al. |
| 2012/0019695 A1 | 1/2012 | Qian et al. |
| 2012/0043634 A1 | 2/2012 | Kurihara |
| 2012/0113290 A1* | 5/2012 | Nakata ............. H04N 5/35554 348/222.1 |
| 2012/0193515 A1 | 8/2012 | Agranov et al. |
| 2012/0228473 A1* | 9/2012 | Yoshitsugu ....... H01L 27/14623 250/208.1 |
| 2013/0038691 A1 | 2/2013 | Agranov et al. |
| 2013/0181309 A1 | 7/2013 | Johnson et al. |
| 2013/0182158 A1 | 7/2013 | Kobayashi et al. |
| 2013/0222552 A1 | 8/2013 | Agranov et al. |
| 2013/0222662 A1 | 8/2013 | Sakurai et al. |
| 2013/0242148 A1 | 9/2013 | Mlinar et al. |
| 2013/0271646 A1 | 10/2013 | Hamano |
| 2013/0329116 A1* | 12/2013 | Margalit ............. G02B 5/287 348/340 |
| 2014/0192248 A1 | 7/2014 | Kishi |
| 2015/0001589 A1 | 1/2015 | Tazoe et al. |
| 2015/0002709 A1 | 1/2015 | Masagaki |
| 2015/0062422 A1 | 3/2015 | Stern |
| 2015/0312461 A1 | 10/2015 | Kim et al. |
| 2015/0312537 A1* | 10/2015 | Solhusvik ............. H04N 9/045 348/302 |

* cited by examiner

US 9,888,198 B2

IMAGING SYSTEMS HAVING IMAGE SENSOR PIXEL ARRAYS WITH SUB-PIXEL RESOLUTION CAPABILITIES

BACKGROUND

This relates generally to imaging devices, and more particularly, to imaging devices with photodiodes having sub-pixel resolution capabilities.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels. The image pixels contain a single photodiode for generating charge in response to image light.

Conventional imaging systems employ a single image sensor in which the visible light spectrum is sampled by red, green, and blue (RGB) image pixels arranged in a Bayer mosaic pattern. The Bayer Mosaic pattern consists of a repeating cell of two-by-two image pixels, with two green pixels diagonally opposite one another, and the other corners being red and blue.

In certain applications, it may be desirable to capture high-dynamic range images. While highlight and shadow detail may be lost using a conventional image sensor, highlight and shadow detail may be retained using image sensors with high-dynamic-range imaging capabilities.

Common high-dynamic-range (HDR) imaging systems use multiple images that are captured by the image sensor, each image having a different exposure time. Captured short-exposure images may retain highlight detail while captured long-exposure images may retain shadow detail. In a typical device, alternating pairs of rows of pixels capture short and long exposure images to avoid breaking up the Bayer mosaic pattern across exposure times, which can limit the spatial resolution and generates motion artifacts in the final HDR image.

It would therefore be desirable to be able to provide imaging devices with oversampling capabilities and improved means of capturing and processing image signals.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
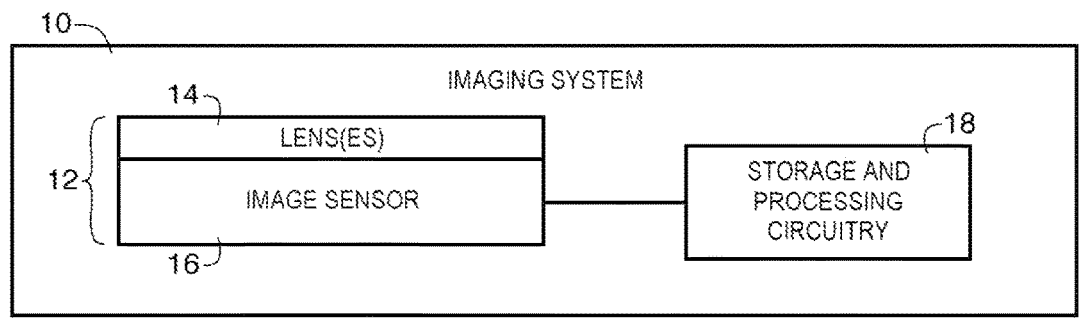
FIG. 1 is a diagram of an illustrative electronic device having an image sensor and processing circuitry for capturing images using an array of image pixels having photosensitive regions with sub-pixel resolution capabilities and shared charge storage nodes in accordance with an embodiment of the present invention.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
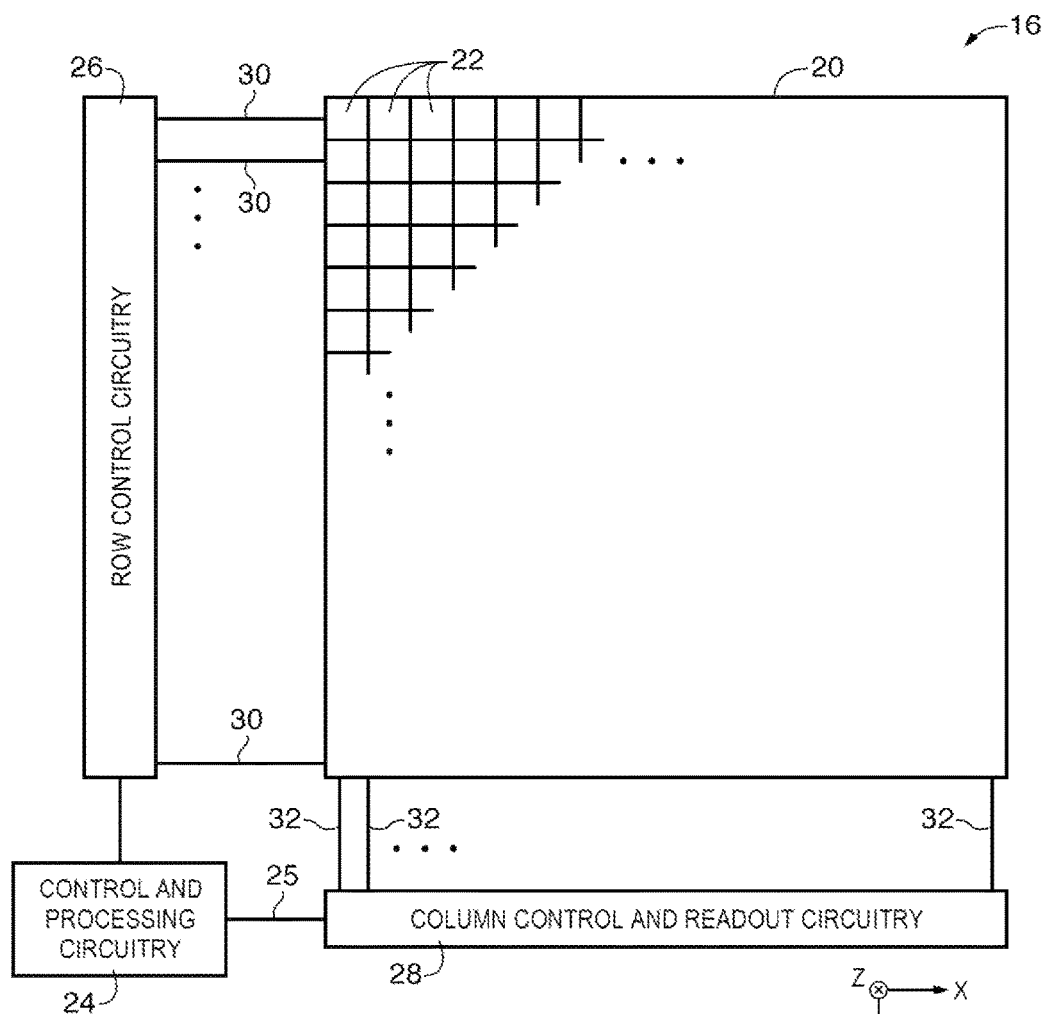
FIG. 2 is a diagram of an illustrative pixel array and associated readout circuitry for reading out image signals from the pixel array in accordance with an embodiment of the present invention.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. However, limitations of signal to noise ratio (SNR) that are associated with the Bayer Mosaic pattern make it difficult to reduce the size of image sensors such as image sensor 16. It may therefore be desirable to be able to provide image sensors with an improved means of capturing images. In another suitable example, the green pixels in a Bayer pattern are replaced by broadband image pixels having broadband color filter elements. These examples are merely illustrative and, in general, color filter elements of any desired color and in any desired pattern may be formed over any desired number of image pixels 22.

Figure 3:
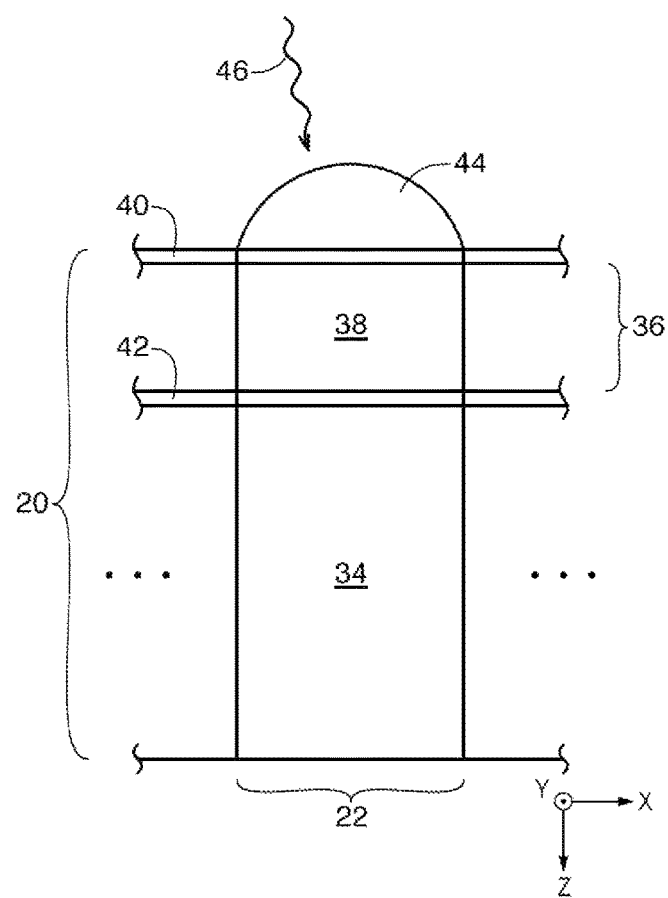
FIG. 3 is a cross-sectional diagram of an illustrative pixel array having photosensitive regions and a color filter array for passing light of a corresponding color to the photosensitive regions in accordance with an embodiment of the present invention.

FIG. 3 is an illustrative cross-sectional diagram of an image pixel 22 in array 20. As shown in FIG. 3, a color filter array such as color filter array 36 may be formed over photosensitive regions 34 in array 20 so that a desired color filter element 38 in color filter array 36 is formed over an upper surface of the photosensitive region 34 of an associated pixel 22. A microlens such as microlens 44 may be formed over an upper surface of color filter array 36 to focus incoming light such as image light 46 onto the photosensitive region 34 associated with that pixel 22. Incoming light 46 may be focused onto photosensitive region 34 by microlens 44 and may pass through color filter element 38 so that only light of a corresponding color is captured at photosensitive region 34. If desired, optional masking layer 40 may be interposed between color filter element 38 and microlens 44 for one or more pixels 22 in array 20. In another suitable arrangement, optional masking layer 42 may be interposed between color filter element 38 and photosensitive region 34 for one or more pixels 22 in array 20. Masking layers 40 and 42 may include metal masking layers or other filtering layers that block a portion of image light 46 from being received at photosensitive region 34. Masking layers 40 and 42 may, for example, be provided to some image pixels 22 to adjust the effective exposure level of corresponding image pixels 22 (e.g., image pixels 22 having masking layers may capture less light relative to image pixels 22 without masking layers). If desired, image pixels 22 may be formed without any masking layers.

The example of FIG. 3 is merely illustrative. If desired, pixels 22 may include multiple photosensitive regions 34. For example, a given pixel 22 may include two photosensitive regions 34, three photosensitive regions 34, four photosensitive regions 34, more than four photosensitive regions 34, etc. Each photosensitive region 34 in a given pixel 22 may share a common charge storage region and may transfer charge generated in response to image light 46 to the shared charge storage region. In general, any desired number of microlenses 44 may be formed over pixels 22. For example, a respective microlens 44 may be formed over each photosensitive region 34 in a given pixel 22, a single microlens 44 may be shared by multiple photosensitive regions 34 in a given pixel 22, pixels 22 may be formed without microlenses, etc. Any desired number of color filter elements 38 may be provided over a single pixel 22. For example, zero, one, two, three, four, or more than four different color filter elements may be formed over a given pixel 22. In one suitable arrangement, a respective color filter element 38 may be formed over each photosensitive region 34 in a given pixel 22. In another suitable arrangement, a single color filter element 38 may be shared by two or more photosensitive regions 34 in a given pixel 22.

Figure 4:
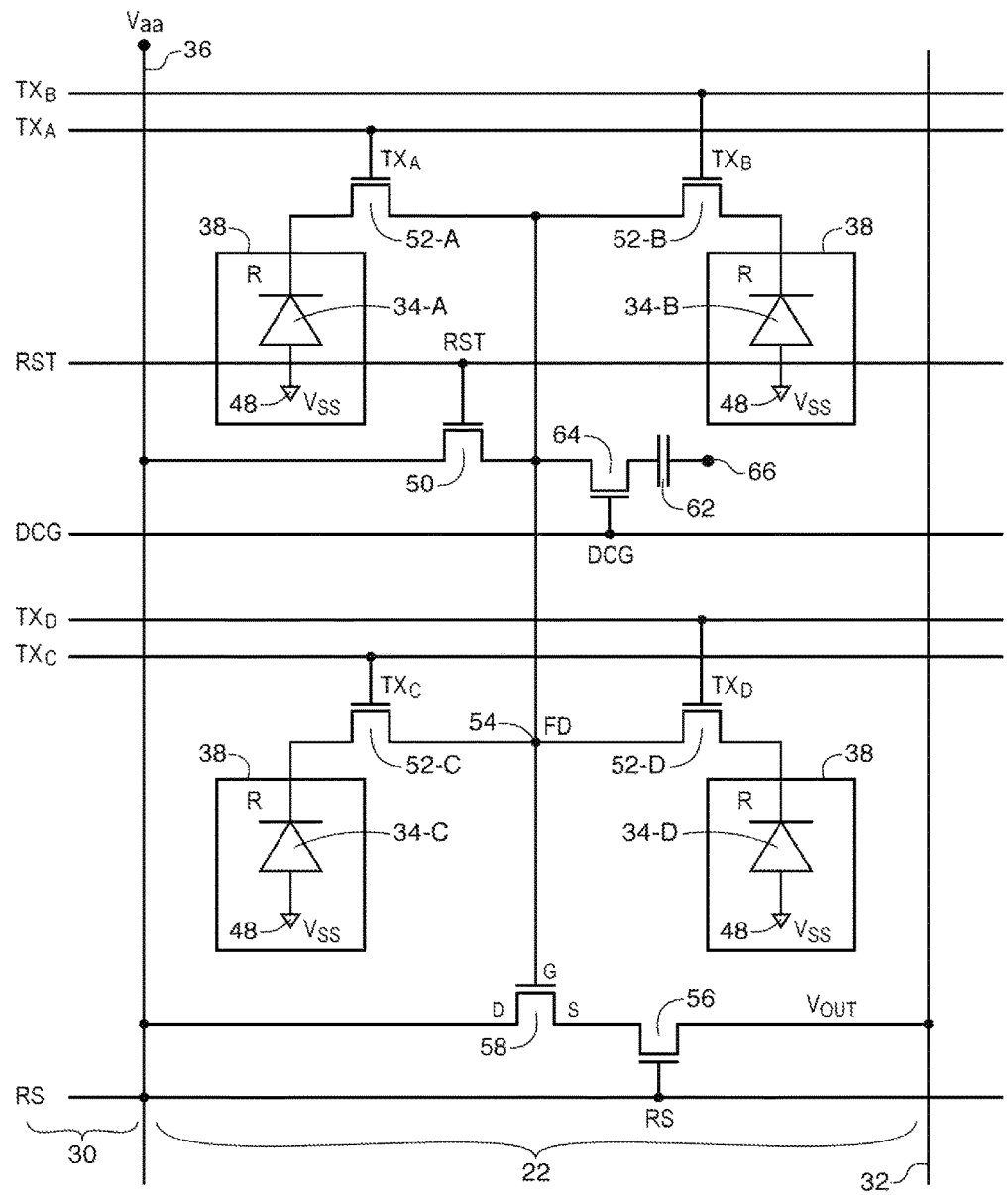
FIG. 4 is a circuit diagram of an illustrative image sensor pixel having multiple photodiodes (e.g., multiple sub-pixels) with a shared charge storage region in accordance with an embodiment of the present invention.

FIG. 4 is a circuit diagram of an illustrative image sensor pixel 22 having multiple photosensitive regions 34. As shown in FIG. 4, image pixel 22 may include multiple photosensitive regions (photosensitive elements) such as photodiodes 34 (e.g., a first photodiode 34-A, a second photodiode 34-B, a third photodiode 34-C, and a fourth photodiode 34-D). A positive power supply voltage (e.g., voltage Vaa or another reset-level voltage) may be supplied at positive power supply terminal 36. A ground power supply voltage (e.g., Vss) may be supplied at ground terminals 48. Incoming light may be collected by photosensitive elements such as photodiodes 34 after passing through corresponding color filter structures such as color filter elements 38.

In the example of FIG. 4, each photodiode 34 is provided with a respective red (R) color filter element 38 so that photodiodes 34 generate charge in response to red light. Color filter elements 38 covering each photodiode 34 in pixel 22 may all be the same color (e.g., red, blue, green, yellow, clear, etc.) or may be different colors (e.g., a first pair of photodiodes 34 in pixel 22 may be provided with blue color filter elements 38 and a second pair of photodiodes 34 in pixel 22 may be provided with red color filter elements 38, each photodiode may be provided with a different colored color filter element, etc.). Color filter elements 38 may be formed from a single continuous color filter element that covers each of photodiodes 34 (sometimes referred to herein as a color plane), may be formed from multiple color filter elements that cover multiple photodiodes 34 (e.g., a single color filter element may cover a first pair of photodiodes 34, a single color filter element may cover a second pair of photodiodes 34, etc.), or may be formed from separate distinct color filter elements that each cover a corresponding photodiode 34. Photodiodes 34 convert the incoming light that passes through the corresponding color filter element into electrical charge.

If desired, control circuitry 26 (as shown in FIG. 2) may assert reset control signal RST before an image is acquired. This turns on reset transistor 50 and resets charge storage node 54 (also referred to as floating diffusion node FD or floating diffusion region FD) to Vaa or another reset-level voltage. Charge storage node 54 may be shared by each photosensitive region 34 in pixel 22 and may store charge generated by each photosensitive region 34 in pixel 22.

Charge storage node 54 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiodes 34 (e.g., region 54 may have a corresponding charge capacity indicative of the amount of charge that can be stored at region 54). The signal associated with the stored charge on node 54 is conveyed to row select transistor 56 by source-follower transistor 58.

Each photodiode 34 in pixel 22 may be coupled to shared charge storage region 54 through a corresponding charge transfer gate 52 (e.g., a first charge transfer gate 52-A may be coupled between photodiode 34-A and node 54, a second charge transfer gate 52-B may be coupled between photodiode 34-B and node 54, a third charge transfer gate 52-C may be coupled between photodiode 34-C and node 54, and a fourth charge transfer gate 52-D may be coupled between photodiode 34-D and node 54). Control circuitry 26 may provide corresponding charge transfer control signals TX to the gate terminal of each charge transfer gate 52 (e.g., may provide a first charge transfer control signal $TX_A$ to charge transfer gate 52-A, may provide a second charge transfer control signal $TX_B$ to charge transfer gate 52-B, etc.).

The reset control signal RST may be deasserted to turn off reset transistor 50. After the reset process is complete, transfer gate control signals TX may be asserted to turn on corresponding transfer gates 52. When transfer transistors 52 are turned on, the charge that has been generated by the corresponding photodiode 34 in response to incoming light is transferred to shared charge storage node 54. Transfer gates TX may be pulsed once to perform one charge transfer operation or may be pulsed multiple times to perform multiple charge transfer operations (e.g., to extend the effective charge well capacity of the corresponding photodiodes). When it is desired to read out the value of the stored charge (i.e., the value of the stored charge that is represented by the signal at the source S of transistor 58), row select control signal RS may be asserted. When signal RS is asserted, transistor 56 turns on and a corresponding image signal $V_{OUT}$ that is representative of the magnitude of the charge on shared charge storage node 54 (e.g., a reset-level or an image-level voltage from one or more photodiodes 34 in pixel 22) is produced on output path 32. In a typical configuration, there are numerous rows and columns of image pixels such as image pixel 22 in image pixel array 20. When row select control signal RS is asserted in a given row, a path such as column line 32 may be used to route signal $V_{OUT}$ from that image pixel to readout circuitry such as image readout circuitry 28 of FIG. 2. If desired, reset-levels and image-levels may be sampled, held, and converted for each image pixel 22 to allow for kTc reset noise compensation, for example.

If desired, pixel 22 may be operated in so-called "low resolution" and "high resolution" modes. In the low resolution mode, charge is transferred (e.g., constructively transferred) from each photodiode 34 to shared charge storage region 54 and image signals corresponding to a sum of the transferred charges (e.g., the charge generated by each of photodiodes 34) is stored at region 54 and readout over column line 32. For example, charge may be transferred from each of photodiodes 34 to shared charge storage node 54 simultaneously. Image signals corresponding to a sum of the transferred charges may enable greater signal-to-noise ratio (SNR) relative to image signals read out using the high resolution mode but may sacrifice spatial resolution in the final image. In the high resolution mode, charge is transferred from a single photodiode 34 to shared charge storage node 54 at a time, and image signals corresponding to the charge generated by each photodiode 34 is separately read-out and sampled over column line 32 by readout circuitry 28. Image signals read out separately for each photodiode 34 in pixel 22 (e.g., in the high resolution mode) may allow for improved spatial resolution in the final image (e.g., demosaicked images produced using readout circuitry 28) relative to image signals read out in the low resolution mode.

Pixels 22 may be provided with gain selection circuitry that enhances the dynamic range of the images produced by image sensor 16. For example, each pixel may generate a corresponding output value using a selected gain setting. In some configurations, a selected gain setting may depend on the amount of light captured by the pixel during an exposure (i.e., an integration period between resets of the pixel during which a photosensitive element generates charges in response to incoming light). In other configurations, the gain may be kept at a constant setting. As shown in FIG. 4, image pixel 28 may include capacitor 64 and transistor 62 coupled in series between terminal 66 and shared floating diffusion node 54. In one suitable arrangement, terminal 66 may be coupled to positive power supply voltage Vaa. In another suitable arrangement, terminal 66 may be coupled to ground power supply Vss. Transistor 64 may have a gate terminal that is controlled using dual conversion gain signal DCG. Pixel 22 may be operable in a high conversion gain mode and in a low conversion gain mode. If transistor 64 is disabled (e.g., if signal DCG is low), pixel 22 is placed in the high conversion gain mode. If transistor 64 is enabled (e.g., if signal DCG is high), pixel 22 is placed in the low conversion gain mode.

In general, pixel conversion gain is inversely proportional to the amount of loading capacitance at node FD. When transistor 64 is turned on, capacitor 62 is switched into use in order to provide shared floating diffusion node 54 with additional capacitance (e.g., additional charge storage capacity). This results in a lower conversion gain for pixel 22. When transistor 64 is turned off, the additional loading of capacitor 66 is removed and pixel 22 reverts to a relatively higher pixel conversion gain configuration. If desired, pixel 22 may be operated in high conversion gain mode (e.g., transistor 64 may be turned off) when operating in the high resolution mode and may be operated in low conversion gain mode (e.g., transistor 64 may be turned on) when operating in the low resolution mode (e.g., because total transferred charge stored on node 54 will be less when reading out individual photodiodes 34 in the high resolution mode than compared to the sum of charges transferred by each photodiode 34 to node 54 in the low resolution mode). In this way, low conversion gain may be provided to accommodate charge summing (multiple pixel) readout when operating in the low resolution mode, for example.

In the example of FIG. 4, four photodiodes 34 are arranged in two adjacent (e.g., consecutive) rows and two adjacent columns. This example is merely illustrative. In general, pixel 22 may be defined as any number of photodiodes 34 sharing a common charge storage node 54, reset transistor 50, and row select transistor 56. For example, pixel 22 may include one photodiode 34, two photodiodes 34 that share a single floating diffusion node 54, reset gate 50, and row select gate 56, three photodiodes 34 that share a single floating diffusion node 54, reset gate 50, and row select gate 56, more than four photodiodes 34 that share a single floating diffusion node 54, reset gate 50, and row select gate 56, etc. Photodiodes 34 within pixels 22 may be arranged in any desired manner. For example, each photodiode 34 in a given pixel 22 may be arranged in a single row, a single column, multiple adjacent rows, or multiple adjacent columns.

Photosensitive regions 34 within pixel 22 may sometimes be referred to herein as sub-pixels 34 (e.g., sub-pixels that share a common charge storage region within an associated pixel 22). Pixels 22 may sometimes be referred to herein as a super-pixel 22, because pixels 22 may include multiple sub-pixels 34. Sub-pixels 34 provided with red color filter elements may sometimes be referred to herein as red sub-pixels 34, sub-pixels provided with blue color filter elements may sometimes be referred to herein as blue sub-pixels 34, sub-pixels 34 provided with green color filter elements may sometimes be referred to herein as green sub-pixels 34, sub-pixels 34 provided with broadband color filter elements may sometimes be referred to herein as broadband sub-pixels 34, etc. In another suitable arrangement, pixel 22 may include eight sub-pixels 34 that share a common floating diffusion region 54. In this scenario, the eight sub-pixels 34 may be arranged in two columns and four rows. The first two rows of sub-pixels may include four red sub-pixels 34, whereas the second two rows of sub-pixels may include four green sub-pixels 34. In another suitable arrangement, the second two rows may include four clear sub-pixels 34.

If desired, the pixel 22 shown in FIG. 4 may be formed adjacent to two pixels 22 covered with green color filter elements 38 (e.g., two pixels 22 each having four green sub-pixels 34) that are diagonally opposite to one another and may be formed diagonally opposite to a pixel 22 covered with blue color filter elements 38 (e.g., a pixel 22 having four blue sub-pixels 34) to form a unit cell of repeating pixels 22. This pattern (unit cell) of pixels 22 may be repeated across array 20. In this way, a Bayer mosaic pattern of pixels 22 may be formed across array 20, where each pixel 22 includes four sub-pixels 34 arranged in two corresponding adjacent rows and two corresponding adjacent columns, having a shared charge storage region 54, and that generate image signals in response to a corresponding color of light. In an arrangement of this type, two (dual) column lines may be used to gather red and green image signals generated by vertically adjacent image pixels 22, thereby improving the readout time relative to conventional Bayer mosaic image sensors in which a single column line is used to readout vertically adjacent pixels. As an example, a first two-by-two group of sub-pixels 34 may share a common floating diffusion node and a second two-by-two group of sub-pixels 34 may share a separate common floating diffusion node. The second two-by-two group may be located in two rows immediately below the first two-by-two group in the array. The first group may share a first column output line, whereas the second group may share a second column output line. Both the first and second groups in this example may be read out simultaneously. For example, sub-pixels in the first and third rows may be read out simultaneously over the two column output lines and the second and fourth rows may be read out simultaneously over the two column output lines, thereby improving readout speed relative to embodiments where both the first and second groups share a single column output line.

Figure 5:
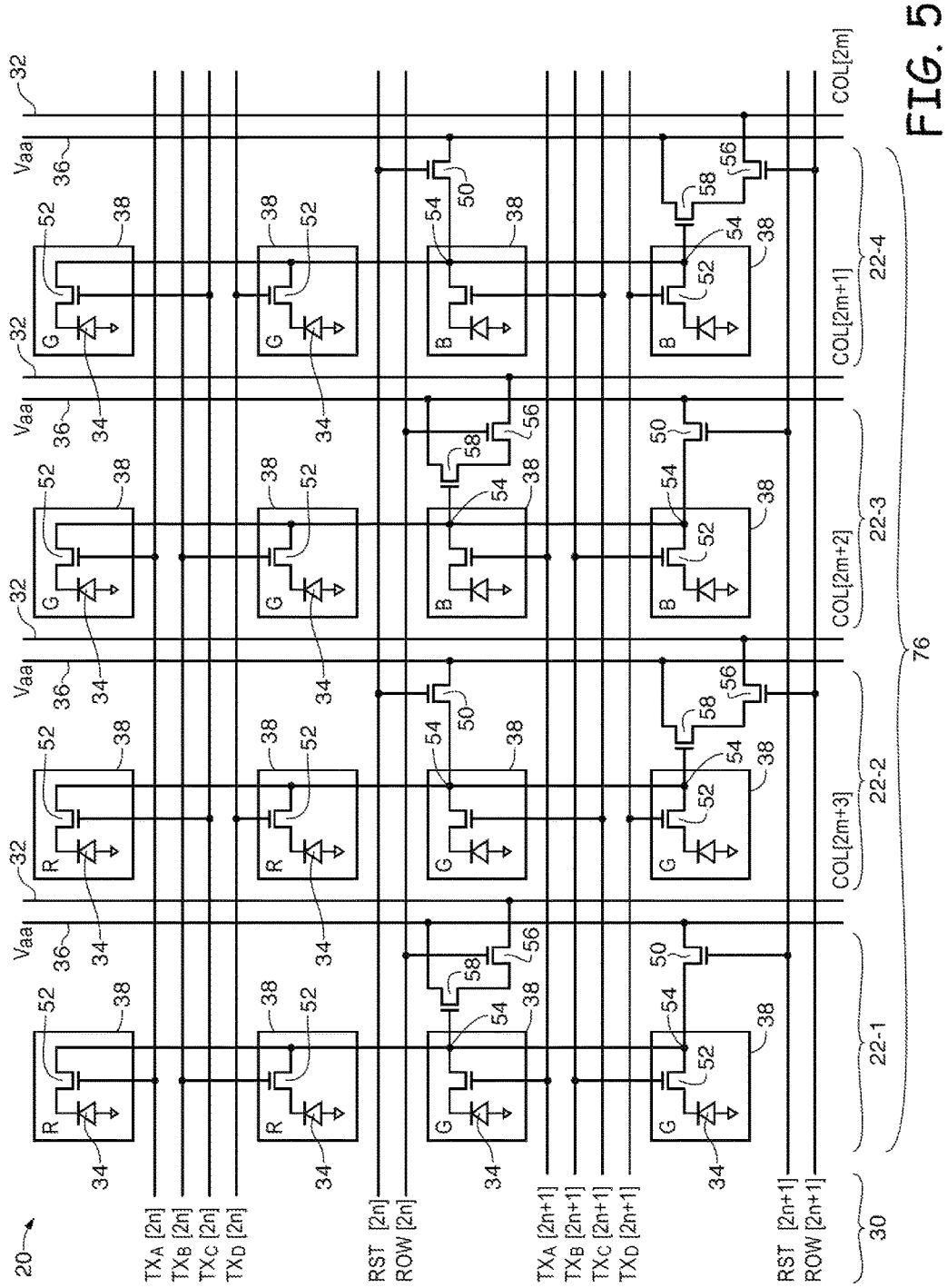
FIG. 5 is a circuit diagram of an illustrative image sensor pixel array having pixels with multiple photodiodes and a shared charge storage region arranged in a single column in accordance with an embodiment of the present invention.

FIG. 5 is a circuit diagram showing an example of another illustrative arrangement for image pixels 22 (e.g., a first image pixel 22-1, a second image pixel 22-2, a third image pixel 22-3, and a fourth image pixel 22-4) within array 20. As shown in FIG. 5, each pixel 22 in array 20 may include four sub-pixels 34 arranged in a single column. The sub-pixels 34 in the first pair of rows of first pixel 22-1 and second pixel 22-2 may be covered with red (R) color filter elements 38, the second pair of rows of first pixel 22-1 and second pixel 22-2 may be covered with green (G) color filter elements 38, the first pair of rows of third pixel 22-3 and fourth pixel 22-4 may be covered with green (G) color filter elements 38, and the second pair of rows of third pixel 22-3 and fourth pixel 22-4 may be covered with blue (B) color filter elements 38. If desired, adjacent red color filter elements 38 may be formed from a single continuous red color filter element (e.g., a single red color filter element may cover portions of both first pixel 22-1 and second pixel 22-2), adjacent green color filter elements 38 may be formed from a single continuous green color filter element (e.g., a single green color filter element may cover portions of both pixels 22-1 and 22-2), etc. The arrangement of pixels 22 shown in FIG. 5 may form a unit cell 76 that is repeated across array 20 to form a Bayer mosaic pattern with color filters 38. In this way, each pixel 22 in array 20 may generate charge in response to light of multiple different colors and may store the charge in shared charge storage nodes 54. The diagram of FIG. 5 does not show a DCG transistor 64 or capacitor 62 (e.g., as shown in FIG. 4) for the sake of simplicity. If desired, each pixel 22 in FIG. 5 may include a DCG transistor 64 and capacitor 62 coupled to the corresponding floating diffusion node 54.

The example of FIGS. 4 and 5 are merely illustrative. If desired, sub-pixels 34 may be provided with color filter elements of any desired colors (e.g., the red, green, and blue color filter elements of FIGS. 4 and 5 may be replaced with infrared color filter elements, ultraviolet color filter elements, red color filter elements, blue color filter elements, magenta color filter elements, cyan color filter elements, clear color filter elements, yellow color filter elements, etc.). Limitations of signal to noise ratio (SNR) that are associated with the Bayer Mosaic pattern can make it difficult to reduce the size of image sensors such as image sensor 16. In one suitable arrangement that is sometimes discussed herein as an example, the green color filter elements shown in FIGS. 4 and 5 are replaced by broadband color filter elements. For example, array 20 as shown in FIG. 5 may include four adjacent red sub-pixels 34 formed diagonally opposite to four adjacent blue sub-pixels 34 and adjacent to four broadband sub-pixels 34 that are diagonally opposite to four additional broadband sub-pixels 34. In another suitable arrangement, each pixel 22 may include a single photosensitive region 34 and pixels 22 may be arranged in four-pixel by four-pixel repeating unit cells each having four red pixels 22 in the first two columns of the first two rows of the unit cell, four green pixels 22 in the third and fourth columns of the first two rows of the unit cell, four green pixels 22 in the third and fourth rows of the first two columns of the unit cell, and four blue pixels 22 in the third and fourth rows of the third and fourth columns of the unit cell.

In another suitable arrangement, the red color filter element in the first row, second column, the red color filter element in the second row, first column, the blue color filter element in the fourth row, third column, the and the blue color filter element in the third row, fourth column of FIG. 5 may be replaced with green color filters 38. In this scenario, the green color filter element in the third row, first column, the green color filter element in the first row, third column, and the blue color filter element in the third row, third column may be replaced with red color filters 38, and the red color filter in the second row, second column, the green color filter element in the fourth row, second column, and the green color filter element in the second row, fourth column may be replaced with blue color filter elements 38. In general, any desired color filter elements may be used.

Broadband sub-pixels 34 may be formed with a visibly transparent color filter that transmits light across the visible light spectrum (e.g., broadband sub-pixels 34 may be provided with clear color filter elements 38 and may capture white light). Broadband sub-pixels 34 may have a natural sensitivity defined by the material that forms the transparent color filter 38 and/or the material that forms the corresponding photosensitive region (e.g., silicon). In another suitable arrangement, broadband sub-pixels 34 may be formed without any color filter elements. The sensitivity of broadband sub-pixels 34 may, if desired, be adjusted for better color reproduction and/or noise characteristics through use of light absorbers such as pigments. Broadband sub-pixels 34 may be sensitive to light across the entire visible light spectrum or may be sensitive to broad portions of the visible light spectrum. Broadband sub-pixels 34 may be generally defined herein as sub-pixels 34 having a substantial response to any suitable combination of light of at least two of the following colors: red, green, and blue. In this way, broadband sub-pixels 34 may have a broadband response relative to the colored sub-pixels in array 20. If desired, broadband sub-pixels 34 may have clear color filter elements in which a pigment such as a yellow pigment has been added to clear color filter element material (e.g., so that the color filter 38 of broadband sub-pixels 34 pass red and green light and associated broadband image signals are not generated in response to blue light).

Figure 6:
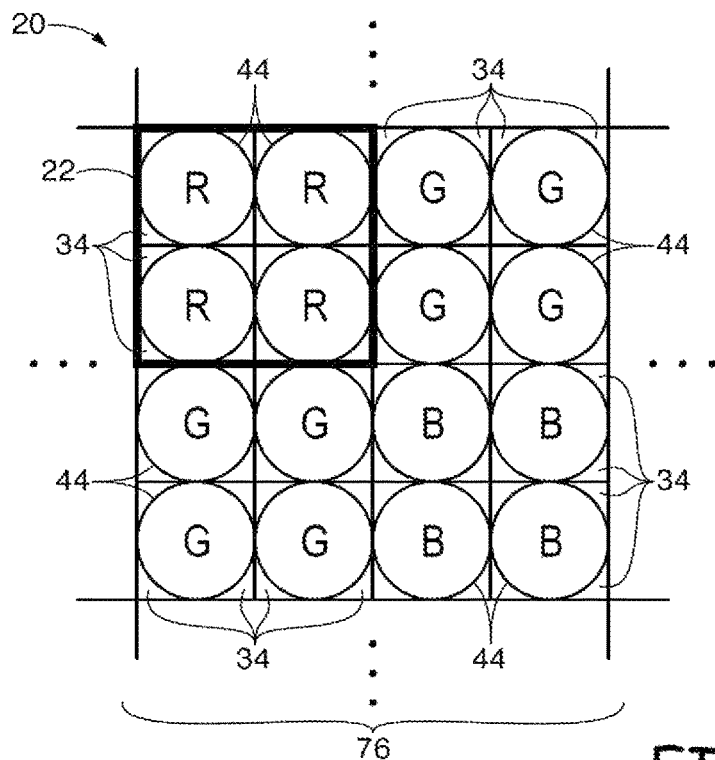
FIG. 6 is a diagram of an illustrative pixel array having rows and columns of photodiodes with sub-pixel resolution capabilities, shared charge storage nodes, and respective microlenses provided for each photodiode in accordance with an embodiment of the present invention.

FIG. 6 is an illustrative diagram showing how respective microlenses such as microlens 44 of FIG. 3 may be formed over each sub-pixel 34 in array 20. As shown in FIG. 6, a unit cell 76 of pixels 22 is provided with corresponding color filter elements. In the example of FIG. 6, unit cell 76 includes a first pixel 22 having four red sub-pixels 34 diagonally opposite to a second pixel 22 having four blue sub-pixels 34 and adjacent to a third pixel 22 having four green sub-pixels 34 diagonally opposite to a fourth pixel 22 having four green sub-pixels 34. Unit cell 76 may be repeated across array 20. Respective microlenses 44 may each be formed over a corresponding sub-pixel 34 in unit cell 76 to focus image light onto that photodiode 34.

Figure 7:
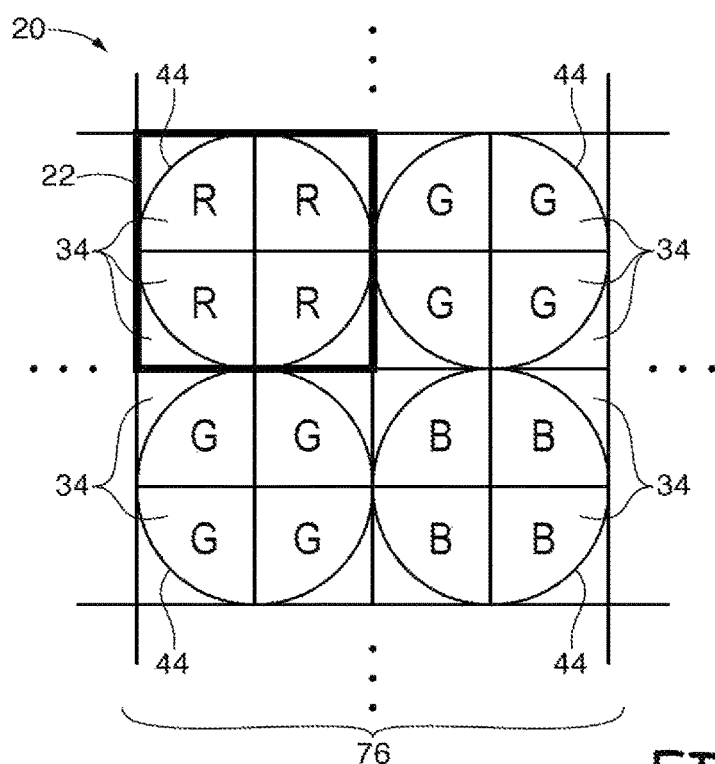
FIG. 7 is a diagram of an illustrative pixel array having rows and columns of photodiodes with microlenses formed over multiple photodiodes located in adjacent pairs of rows and columns of the array in accordance with an embodiment of the present invention.

FIG. 7 is an illustrative diagram showing how microlenses 44 may be shared by multiple sub-pixels 34. As shown in FIG. 7, unit cell 76 may include a first pixel 22 having four red sub-pixels 34 diagonally opposite to a second pixel 22 having four blue sub-pixels 34 and adjacent to a third pixel 22 having four green sub-pixels 34 diagonally opposite to a fourth pixel 22 having four green sub-pixels 34. Unit cell 76 may be repeated across array 20. Respective microlenses 44 may each be formed over a corresponding pixel 22 in unit cell 76 to focus image light onto each of the sub-pixels 34 in that pixel 22. In other words, each sub-pixel 34 within a given pixel 22 may share a single microlens 44.

Figure 8:
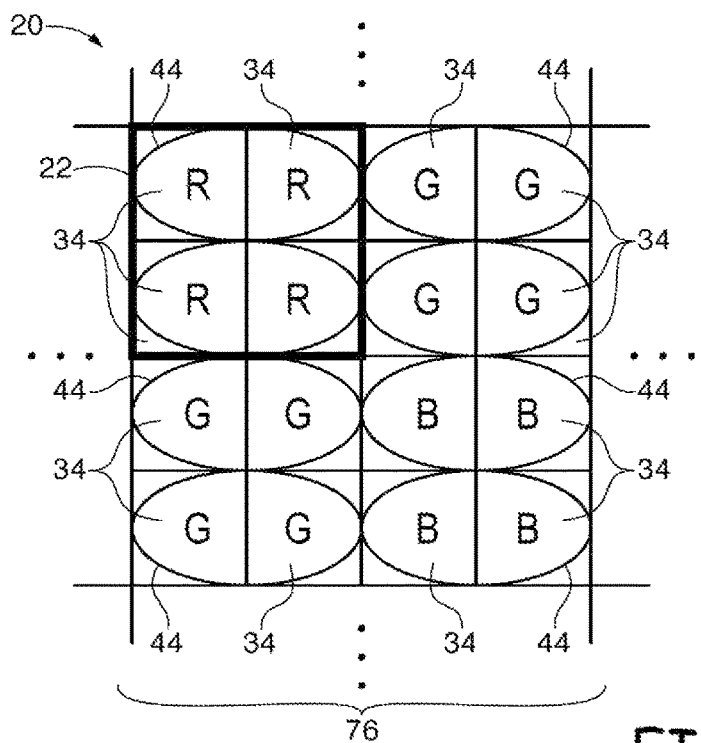
FIG. 8 is a diagram of an illustrative pixel array having multiple photodiodes with microlenses formed over adjacent photodiodes located within a corresponding row of the array in accordance with an embodiment of the present invention.

FIG. 8 is an illustrative diagram showing how microlenses 44 may be formed over multiple sub-pixels 34 within pixels 22. As shown in FIG. 8, unit cell 76 may include a first pixel 22 having four red sub-pixels 34 diagonally opposite to a second pixel 22 having four blue sub-pixels 34 and adjacent to a third pixel 22 having four green sub-pixels 34 diagonally opposite to a fourth pixel 22 having four green sub-pixels 34. Unit cell 76 may be repeated across array 20. Each pixel 22 may include two microlenses 44. For example, each microlens 44 may cover two adjacent sub-pixels 34 in a corresponding pixel 22 for passing image light to the corresponding pair of sub-pixels 34. In the example of FIG. 8, adjacent sub-pixels 34 in a single row are provided with a shared microlens 34 (e.g., microlenses 34 may be arranged horizontally on array 20). In another suitable arrangement, adjacent sub-pixels 34 in a single column may be provided with a shared microlens 34 (e.g., so that microlenses 44 are arranged vertically on array 20). Forming multiple microlenses over multiple sub-pixels 34 within a given pixel 22 may, for example, enable readout circuitry 28 to perform stereo depth mapping operations on the image signals (e.g., as each sub-pixel 34 may capture light received from a respective half of the field of view of a single microlens 44).

The example of FIGS. 6-8 in which pixels 22 include four sub-pixels 34 located in two adjacent rows and two adjacent columns is merely illustrative. If desired, unit cell 76 may include four pixels 22 each having four sub-pixels 34 located in a single column (e.g., in an arrangement as shown in FIG. 5). In general, any desired charge storage sharing scheme may be implemented on array 20 (e.g., sub-pixels 34 in any desired number of adjacent rows and adjacent columns of array 20 may share a single charge storage region 54). If desired, color filter elements of any color may be used. In one suitable arrangement, green sub-pixels 34 as shown in FIGS. 5-9 may be replaced with broadband (e.g., clear, yellow, etc.) sub-pixels 34. If desired, unit cell 76 of sub-pixels 34 may include any desired combination of the microlens arrangements shown in FIGS. 6-8.

If desired, image sensor 16 may be operated in a high-dynamic-range imaging mode. The dynamic range of an image may be defined as the luminance ratio of the brightest element in a given scene to the darkest element the given scene. Typically, cameras and other imaging devices capture images having a dynamic range that is smaller than that of real-world scenes. High-dynamic-range (HDR) imaging systems are therefore often used to capture representative images of scenes that have regions with high contrast, such as scenes that have portions in bright sunlight and portions in dark shadows.

An image may be considered an HDR image if it has been generated using imaging processes or software processing designed to increase dynamic range. As an example, HDR images may be captured by a digital camera using a multiple integration (or multiple exposure (ME)) process. In a multiple exposure process, multiple images (sometimes referred to as image frames) of the same scene may be captured using different exposure times (sometimes referred to as integration times). A short-exposure image captured during a short integration time may better capture details of brightly lit portions of the scene, whereas a long-exposure image captured during a relatively longer integration time may better capture details of dark portions of the scene. The short-exposure and long-exposure images may be combined into a composite HDR image which is able to represent the brightly lit as well as the dark portions of the image.

In another suitable arrangement, HDR images may be captured by a digital camera using an interleaved integration (or interleaved exposure (IE)) process. In an interleaved integration process, images having rows of long-exposure image pixel values are interleaved with rows of short-exposure image pixel values. The long-exposure and short-exposure image pixel values in each interleaved image frame may be interpolated to form interpolated values. A long-exposure image and a short-exposure image may be generated using the long-exposure and the short-exposure values from the interleaved image frame and the interpolated. The long-exposure image and the short-exposure image may be combined to produce a composite HDR image which is able to represent the brightly lit as well as the dark portions of the image.

Figure 9:
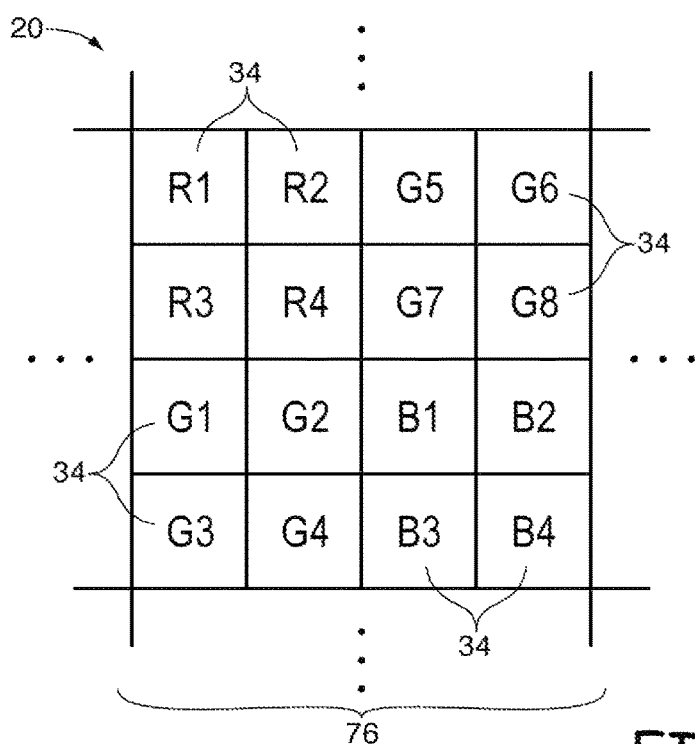
FIG. 9 is a diagram of an illustrative pixel array having multiple photodiodes and respective effective exposure levels that may be used for generating high-dynamic-range (HDR) images in accordance with an embodiment of the present invention.

If desired, sub-pixels 34 may be operated with selected integration times to generate short and long exposure images for generating an HDR image. FIG. 9 is an illustrative diagram showing how sub-pixels 34 in a repeating unit cell 76 of sub-pixels on array 20 may be provided with different integration (exposure) times. Sub-pixels 34 may have any desired charge storage node sharing scheme and may include any desired number of microlenses arranged in any desired manner. As shown in FIG. 9, red sub-pixel R1 may capture charge using a first integration time, red sub-pixel R2 may capture charge using a second integration time, red sub-pixel R3 may capture charge using a third integration time, red sub-pixel R4 may capture charge using a fourth integration time, green sub-pixel G1 may capture charge using a fifth integration time, green sub-pixel G2 may capture charge using a sixth integration time, green sub-pixel G5 may capture charge using a seventh integration time, blue pixel B1 may capture charge using an eighth integration time, etc.

Each integration time used by each sub-pixel 34 may be different, or multiple sub-pixels 34 may share common integration times. In one suitable arrangement, each sub-pixel 34 may capture charge either during a long integration time or a short integration time. For example, sub-pixels 34 in the first and third rows of unit cell 76 may capture charge using a short integration time, whereas the second and fourth rows of unit cell 76 may capture charge using a long integration time. In another suitable arrangement, four different integration times, 8 different integration times, 16 different integration times, more than two integration times, or any other desired integration times may be used to capture charge using sub-pixels 34. In another example, the integration time used by sub-pixel G5 may be equal to the integration time used by sub-pixel G8 and the integration time used by sub-pixel G7 may be equal to the integration time used by sub-pixel G6, the integration time used by sub-pixel G5 may be equal to the integration time used by sub-pixel G1 and the integration time used by sub-pixel G6 may be equal to the integration time used by sub-pixel G2, the integration time used by sub-pixel G5 may be equal to the integration time used by sub-pixel R1 and the integration time used by sub-pixel G8 may be equal to the integration time used by sub-pixel R4, etc. In general, any desired integration times may be used for capturing charge using each of sub-pixels 34.

Integration time may be controlled on array 20 by, for example, controlling the timing of reset signals RST and charge transfer signals TX provided to pixels 22, etc. If desired, an effective integration or effective exposure level (e.g., an effective amount of charge that can be captured by photodiodes 34) may be controlled by adjusting the control signals provided to pixels 22, by forming some pixels with masking layers such as masking layers 40 and 42 of FIG. 3 (e.g., layers which limit the amount of light received by some photodiodes 34 relative to photodiodes 34 without masking layers), by adjusting the shape or arrangement of lenses 14 or 44 (e.g., so that some sub-pixels 34 receive more image light than other sub-pixels 34), by adjusting the size of the corresponding photodiode 34, by providing different color filter elements 38 to each sub-pixel 34 (e.g., so that some sub-pixels 34 capture more light relative to other sub-pixels 34), etc. In general, image signals generated by sub-pixels 34 having different effective exposure levels may be used for generating HDR images (e.g., sub-pixels 34 may generate effective long exposure images and effective short exposure images that may be combined to generate an HDR image, etc.). By generating HDR images using sub-pixels 34, the spatial resolution of the final HDR image may be improved relative to image sensors that use alternating pairs of pixel rows to capture short and long exposure images (e.g., pixel array 20 may have sub-pixel resolution capabilities that provides greater spatial resolution relative to image sensors formed with single photodiode pixels arranged in a Bayer mosaic pattern).

In some scenarios, a neutral density is added in the color filter volume to make some sub-pixels 34 less sensitive (e.g., to provide different effective exposure levels across array 20). In this example, a longer integration time may be used by the corresponding sub-pixels 34, thereby improving SNR in the darker portions of the scenes, as captured by the regular sub-pixels, while preserving highlight detail in the sub-pixels with added neutral density. This approach may eliminate motion artifacts as the integration time profiles may be nearly identical. In addition, this approach may allow imaging device 10 to accurately capture HDR images of flickering light sources such as light-emitting-diodes (LEDs), whereas in scenarios where a short and long integration time are used to capture an HDR imager of the flickering light source, the short integration time may be too short to capture the flickering LED. However, the addition of neutral density in the color filter volume may not be disabled or removed after array 20 is assembled. In another suitable arrangement, pulsed integration may be used by sub-pixels 34, in which the shortest exposure starts and ends at approximately the same time as the longest exposure but with a duty cycle, thereby reducing the exposure by an amount that can be optimized for the dynamic range of the scene being captured. In this example, motion artifacts may be mitigated because the integration profiles of the short and long integrations span the same time interval.

In another suitable arrangement, color filter elements 38 provided to each sub-pixel 34 in unit cell 76 may transmit a different bandwidth (spectrum) of light. For example, the color filter element formed over sub-pixel R1 may pass a first band of red light to the corresponding photodiode, the color filter element formed over sub-pixel R2 may pass a second band of red light to the corresponding photodiode, the color filter element formed over sub-pixel R3 may pass a first band of red light to the corresponding photodiode, etc. If desired, the full spectrum of red colors may be divided among the color filters formed over sub-pixels R1-R4 (e.g., by forming the corresponding color filter elements 38 from different materials or materials having different light absorbing components). As an example, blue sub-pixels B1 and B4 may include color filter elements that transmit light having a wavelength of 400-450 nm, whereas blue sub-pixels B2 and B3 may include color filter elements that transmit light having a wavelength of 450-500 nm (thereby covering the entire spectrum of blue light from 400-500 nm). In another example, blue sub-pixels B1 and B4 may include color filter elements that transmit light having a wavelength from 400-500 nm, whereas blue sub-pixel B2 may include a color filter element that transmits light having a wavelength from 400-450 nm and blue sub-pixel B3 may include a color filter element that transmits light having a wavelength from 450-500 nm. In this way, additional spectral information useful for improving color reproduction and/or image processing algorithms may be obtained. Similar filters may be implemented for the other colored sub-pixels in array 20.

Figure 10:
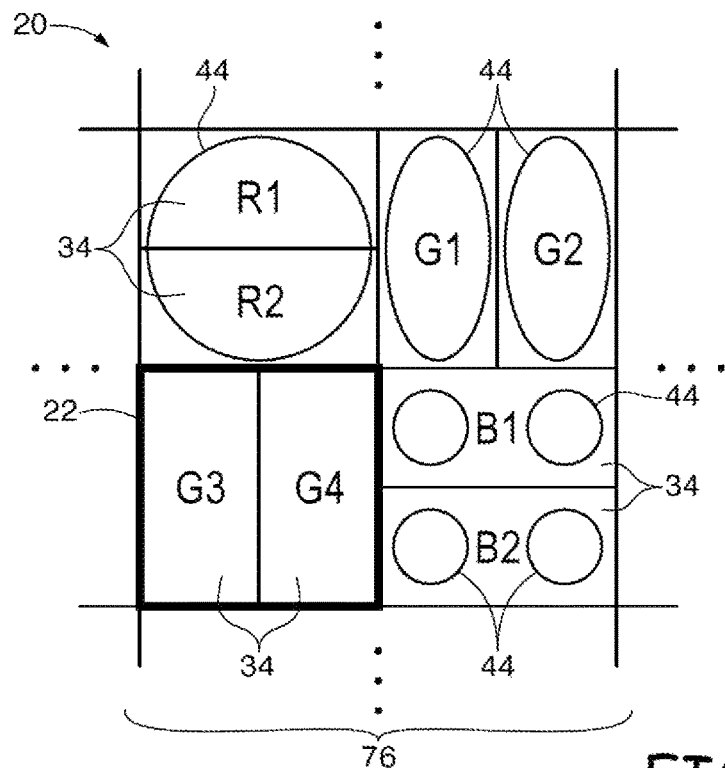
FIG. 10 is a diagram of an illustrative pixel array having multiple elongated photosensitive regions with different corresponding effective exposure levels and microlenses for generating HDR images in accordance with an embodiment of the present invention.

If desired, sub-pixels 34 may have an elongated shape as shown in FIG. 10. As shown in FIG. 10, unit cell 76 may include four pixels 22 each having two elongated sub-pixels 34 that share a common floating diffusion node 54. Elongated sub-pixels 34 may, for example, include rectangular photosensitive regions or otherwise elongated photosensitive regions. Elongated sub-pixels 34 may be oriented vertically (e.g., as shown by green sub-pixels G1, G2, G3, and G4) or may be oriented horizontally (e.g., as shown by red sub-pixels R1 and R2 and blue sub-pixels B1 and B2). If desired, each sub-pixel 34 in unit cell 76 may be oriented horizontally, each sub-pixel may be oriented vertically, or unit cell 76 may include sub-pixels arranged both horizontally and vertically (e.g., as shown in FIG. 10). Elongated sub-pixels 34 may be provided with any desired integration time or effective exposure level (e.g., different integration times or one or more similar integration times). Elongated sub-pixels 34 may each be provided with multiple microlenses 44 (e.g., as shown by blue sub-pixels B1 and B2), may each be provided with respective microlenses 44 (e.g., as shown by green sub-pixels G1 and G2), may be provided with no microlenses 44, or may share a single microlens 44 with other sub-pixels 34 (e.g., as shown by red sub-pixels R1 and R1). In general, any desired arrangement for microlenses 44 may be provided for array 20 (e.g., each pixel 22 in unit cell 76 may be provided with the same microlens arrangement or may each be provided with different microlens arrangements).

Figure 11:
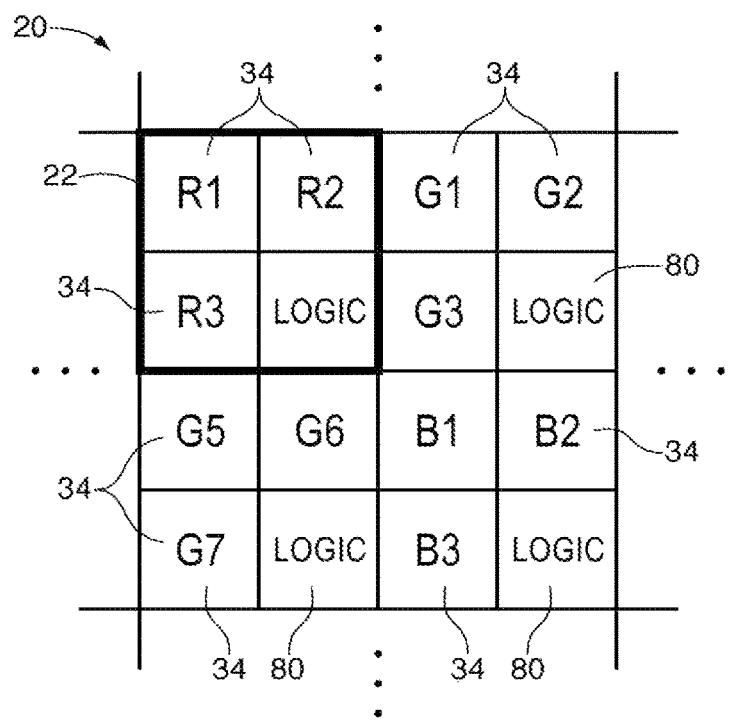
FIG. 11 is a diagram of an illustrative pixel array having multiple photodiodes with shared charge storage nodes and corresponding logic circuitry at predetermined sub-pixel locations within the array in accordance with an embodiment of the present invention.

If desired, one or more sub-pixels 34 on array 20 may be replaced with pixel logic circuitry. FIG. 11 is an illustrative diagram showing how one sub-pixel in each pixel 22 of array 20 may be replaced with logic circuitry 80 (e.g., logic circuitry 80 may be formed at one sub-pixel location in each pixel 22). Logic circuitry 80 may include, for example, the transfer gates 52, reset gate 50, DCG gate 64, source follower 58, row-select gate 56, or any other desired pixel logic associated with the corresponding pixel 22. Readout circuitry 28 of FIG. 2 may, for example, interpolate image signals for the sub-pixel locations of logic circuitry 80 during image processing (e.g., while operating in the high resolution mode). Interpolation of image signals for sub-pixel locations of logic circuitry 80 may be omitted in the low resolution mode. The example of FIG. 11 in which logic circuitry 80 is formed at the bottom-right sub-pixel location of each pixel 22 is merely illustrative. If desired, logic circuitry 80 may be formed at any desired sub-pixel location in the corresponding pixel 22 and may be formed at randomized locations across array 20 in order to mitigate any image artifacts associated with the missing sub-pixels.

Figure 12:
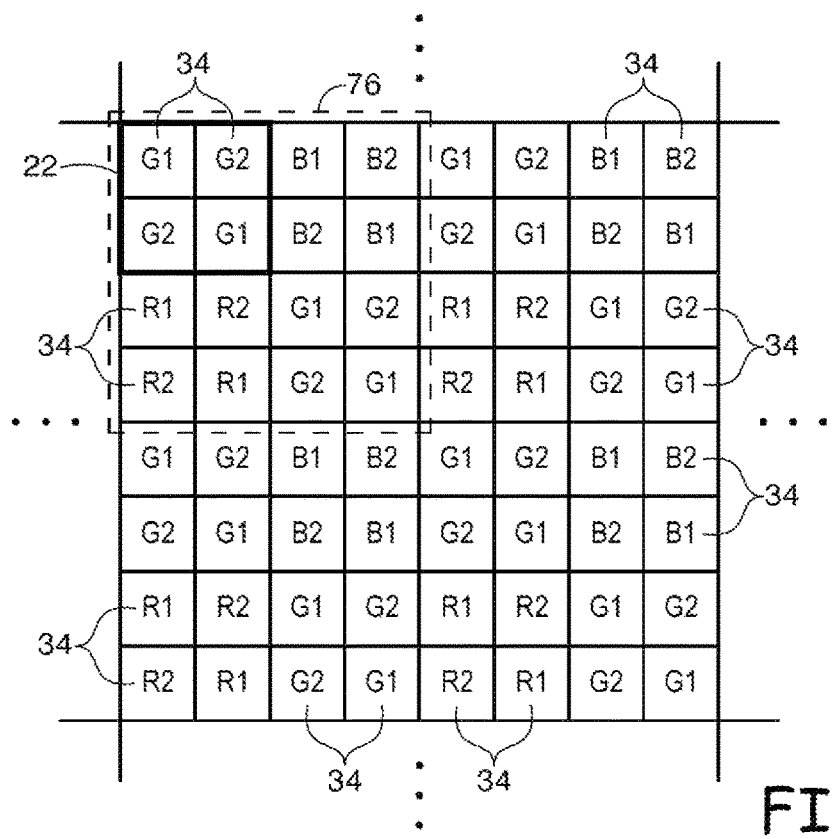
FIG. 12 is a diagram of an illustrative pixel array having multiple photodiodes of different colors that are operated using low and high effective exposure levels at alternating locations within the array for generating HDR images in accordance with an embodiment of the present invention.

FIG. 12 is an illustrative diagram showing how sub-pixels 34 across array 20 may implement different effective exposures levels when generating charge (e.g., for performing high-dynamic range imaging operations). In the example of FIG. 12, a long effective exposure (e.g., a high effective exposure level) and a short effective exposure (e.g., a low effective exposure level) are used by sub-pixels 34 to capture charge in response to image light. The effective exposure level may be set by adjusting the integration time (e.g., using the pixel control signals provided to pixels 22), by adjusting the color filters elements that are formed over sub-pixels 34, by adjusting an aperture size of camera module 12, by adjusting microlens shape, by adjusting photodiode size, etc. so that a different amount of light is captured by different sub-pixels 34.

In the example of FIG. 12, green sub-pixels G1, blue sub-pixels B1, and red sub-pixels R1 may have a first effective exposure level, whereas green sub-pixels G2, blue sub-pixels B2, and red sub-pixels R2 may have a second effective exposure level (e.g., the first exposure level may be relatively high (long) exposure level, whereas the second exposure level may be a relatively low (short) exposure level). Image signals generated by the sub-pixels provided with the relatively high exposure level may be interpolated to generate one or more long exposure images whereas image signals generated by the sub-pixels provided with the relatively low exposure level may be interpolated to generate one or more short exposure images. The short exposure images and the long exposure images may be combined using any desired image combination algorithm to generate a high-dynamic-range image.

As shown in the example of FIG. 12, unit cell 76 may be repeated across array 20 and may include four pixels 22 each having four sub-pixels 34. Each pixel 22 may include a first low effective exposure level sub-pixel formed diagonally opposite to a second low effective exposure level sub-pixel and adjacent to a first high effective exposure level sub-pixel formed diagonally opposite to a second high effective exposure level sub-pixel, so that every other row and every other column in array 20 includes a long and short effective exposure level sub-pixel 34 (e.g., the long and short effective exposure level sub-pixels may form a checkerboard pattern on array 20). In this example, each low effective exposure level pixel is surrounded by four high effective exposure level pixels, which may induce electronic crosstalk and blooming on the low effective exposure sub-pixel.

Figure 13:
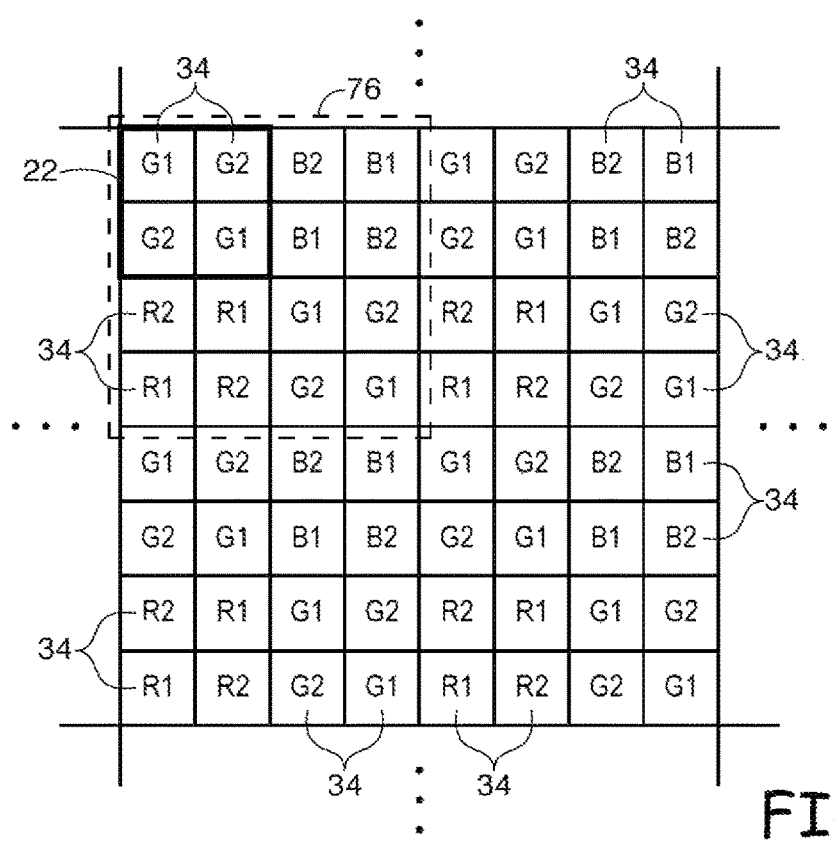
FIGS. 13 and 14 are diagrams of an illustrative pixel array having multiple photodiodes of different colors that are operated using low effective exposure levels at adjacent locations in the array and using high effective exposure levels at adjacent locations in the array for generating HDR images in accordance with an embodiment of the present invention.

FIG. 13 is an illustrative diagram showing another example of how sub-pixels 34 across array 20 may implement different effective exposures levels. As shown in FIG. 13, unit cell 76 may be repeated across array 20 and may include four pixels 22 each having four sub-pixels 34. Each pixel 22 may include a first low effective exposure level sub-pixel formed diagonally opposite to a second low effective exposure level sub-pixel and adjacent to a first high effective exposure level sub-pixel formed diagonally opposite to a second high effective exposure level sub-pixel so that each high effective exposure sub-pixel is formed adjacent to two other high effective exposure sub-pixels and diagonally adjacent to a third high effective exposure level sub-pixel. Similarly, each low effective exposure level sub-pixel is formed adjacent to two other low effective exposure level sub-pixels and diagonally adjacent to a third low effective exposure level sub-pixel. In this way, the high effective exposure level sub-pixels may be grouped together in array 20 and the low effective exposure level sub-pixels in array 20 may be grouped together in array 20.

Figure 14:
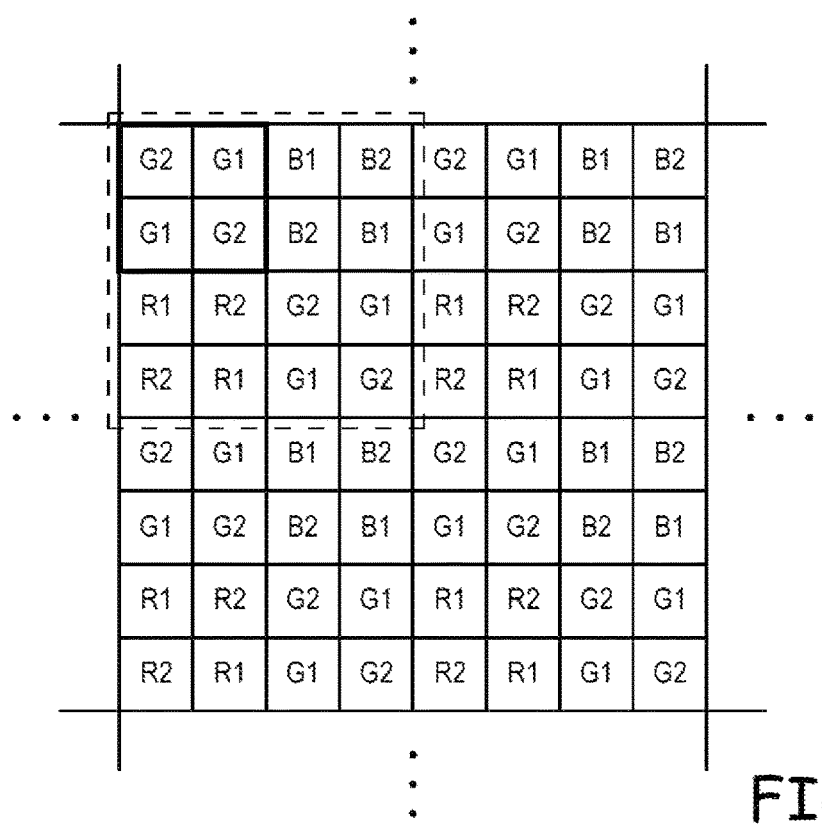

FIG. 14 is an illustrative diagram showing another example of how sub-pixels 34 across array 20 may be implemented using different effective exposure levels so that the high effective exposure level sub-pixels may be grouped together in array 20 and the low effective exposure level sub-pixels in array 20 may be grouped together in array 20. An arrangement of the type shown in FIGS. 13 and 14 may, for example, allow for reduced blooming and electrical crosstalk relative to the arrangement shown in FIG. 12. In scenarios where the effective low exposure level sub-pixels and the effective high exposure level sub-pixels are implemented by adjusting integration timing (e.g., as opposed to adjusting the color filter element), low effective exposure level sub-pixels used to capture a first image frame may be converted to high effective exposure level sub-pixels for capturing a subsequent image frame (e.g., the short and long effective exposure level sub-pixels may alternate integration times across frames to allow for temporal averaging).

The examples of FIGS. 12-14 are merely illustrative. If desired, more than two effective exposure levels may be implemented across array 20. Any desired charge storage region sharing scheme may be implemented (e.g., sub-pixels in pixels 22 having a shared charge storage region 54 may be formed in an adjacent pair of rows and an adjacent pair of columns as shown in FIGS. 12-14, may be formed in a single column as shown in FIG. 5, or may include any other desired sub-pixel locations). Sub-pixels 34 may be provided with any desired color filter elements (e.g., the green sub-pixels 34 in FIGS. 12-14 may be replaced with broadband sub-pixels 34) and with any desired microlens arrangement (e.g., the microlens arrangements of one or more of FIGS. 6-8 may be formed over array 20). If desired, one or more sub-pixels 34 as shown in FIG. 13 may include elongated sub-pixels 34 as shown in FIG. 10 or may be replaced with logic circuitry 80 as shown in FIG. 11. In other words, the effective exposure level of each sub-pixel 34 as shown in FIGS. 6-14 may, if desired, be controlled and adjusted for performing HDR imaging.

Image signals may be read out of array 20 using any desired readout scheme. Each pixel 22 may be addressed by row control circuitry 26 of FIG. 2 individually, by unit cell 76, and/or by sub-pixel 34. Array 20 may be readout in a normal mode in which readout circuitry 28 scans through pixels 22 in a normal sequence by using the extra row and column lines provided for handling control signals for sub-pixels 34 at appropriate times. When operating in a high-dynamic-range mode to generate HDR images, array 20 may, if desired, reset each sub-pixel 34 of a given pixel 22 at different times and may read out the pixels 22 of that group together. If desired, different exposures across sub-pixels 34 may end at the same time, thereby eliminating the need for row buffers to realign exposures of an interleaved multiple exposure.

Figure 15:
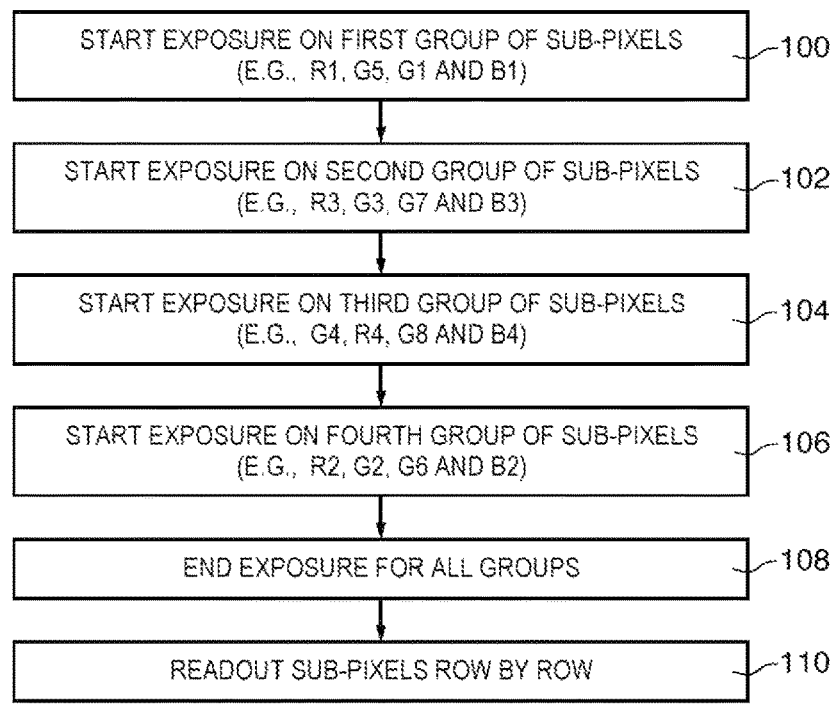
FIG. 15 is a flow chart of illustrative steps that may be performed by pixel arrays of the type shown in FIGS. 2-14 for capturing image signals using different exposure times for generating HDR images in accordance with an embodiment of the present invention.

If desired, array 20 may be operated using a global shutter scheme and multiple exposure times. If desired, exposure (integration) for groups of sub-pixels 34, each including sub-pixels located in every other row and every other column of array 20, may begin at different times, and image signals associated with the captured charge may be read out from the sub-pixels row by row. (e.g., so that exposure begins for sub-pixels in two different rows simultaneously). As an example, array 20 may include repeating unit cell 76 as shown in FIG. 9 and may operate using four different exposure times. In this example, a first group of sub-pixels that includes sub-pixels R1, G5, G1, and B1 may use a first exposure time, a second group of sub-pixels that includes sub-pixels R2, G6, G2, and B2 may use a second exposure time, a third group of sub-pixels that includes sub-pixels R3, G7, G3, and B3 may use a third exposure time, and a fourth group of sub-pixels that includes sub-pixels R4, G8, G4, and B4 may use a fourth exposure time. If desired, each group of sub-pixels may begin integrating charge at a different time and the captured image signals may be read out row by row. FIG. 15 is a flow chart of illustrative steps that may be used by imaging system 10 to perform exposure and readout operations in this scenario.

At step 100, array 20 may begin integrating charge using the first group of sub-pixels 34 (e.g., sub-pixels R1, G1, B1, and G5 of FIG. 9).

At step 102, after charge integration has begun for the first group of sub-pixels, array 20 may begin integrating charge using the second group of sub-pixels (e.g., sub-pixels R3, G3, G7, and B3 of FIG. 9).

At step 104, after charge integration has begun for the second group of sub-pixels, array 20 may begin integrating charge using the third group of sub-pixels (e.g., sub-pixels R4, G4, G8, and B4 of FIG. 9).

At step 106, after charge integration has begun for the third group of sub-pixels, array 20 may begin integrating charge using the fourth group of sub-pixels (e.g., sub-pixels R2, G2, G6, and B2 of FIG. 9).

At step 108, each group of sub-pixels 34 may stop integrating charge (e.g., charge may be transferred to associated charge storage regions 54, a mechanical shutter in camera module 12 of FIG. 1 may be closed, etc.).

At step 110, the image signals generated by sub-pixels 34 may be read out on a row by row basis. For example, sub-pixels R1, R2, G5, and G6 (e.g., sub-pixels in the first row) of FIG. 9 may be read out at a first readout time, sub-pixels R3, R4, G7, and G8 (e.g., sub-pixels in the second row) may subsequently be read out at a second readout time that is after the first readout time, pixels G1, G2, B1, and B2 (e.g., sub-pixels in the third row) may be read out at a third readout time that is after the second readout time, etc.

The example of FIG. 15 is merely illustrative. In general, steps 100-106 may be performed in any desired order. If desired, each exposure may begin at the same time and the exposures in each sub-pixel group may end at different times (e.g., exposure may begin for all rows of sub-pixels simultaneously and may end for only two rows of sub-pixels 34 simultaneously).

Figure 16:
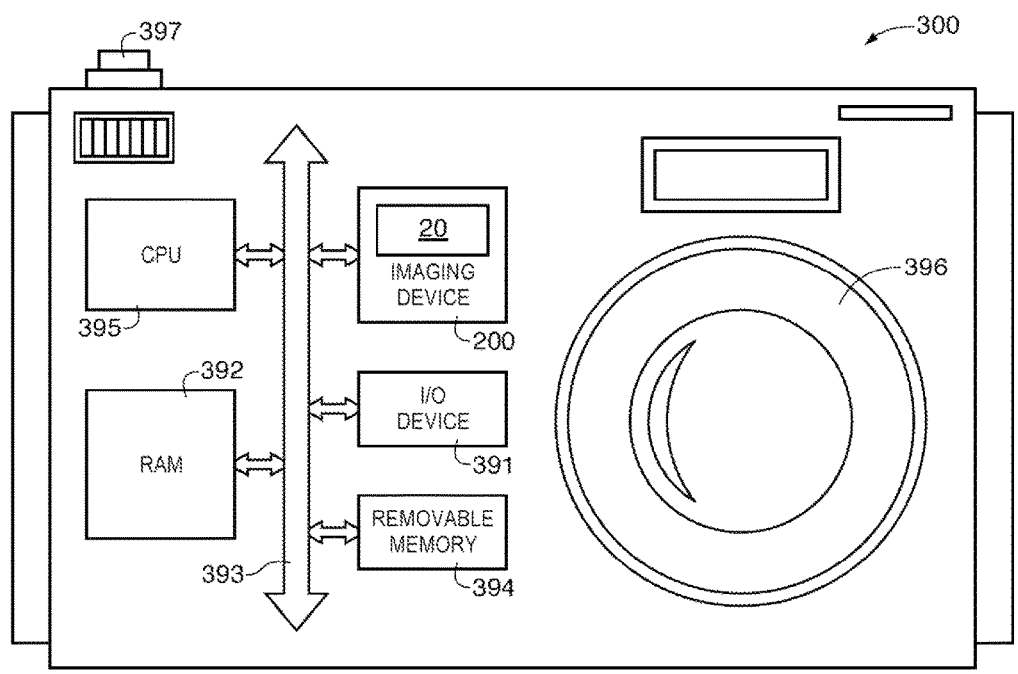
FIG. 16 is a block diagram of a processor system employing the embodiments of FIGS. 1-15 in accordance with an embodiment of the present invention.

FIG. 16 shows in simplified form a typical processor system 300, such as a digital camera, which includes an imaging device 200 (e.g., an imaging device 200 such as device 10 of FIGS. 1-15 and the techniques for capturing images using pixel arrays having photosensitive regions with shared charge storage nodes and sub-pixel resolution capabilities). The processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300 generally includes a lens 396 for focusing an image on pixel array 20 of device 200 when a shutter release button 397 is pressed, central processing unit (CPU) 395, such as a microprocessor which controls camera and one or more image flow functions, which communicates with one or more input/output (I/O) devices 391 over a bus 393. Imaging device 200 also communicates with the CPU 395 over bus 393. The system 300 also includes random access memory (RAM) 392 and can include removable memory 394, such as flash memory, which also communicates with CPU 395 over the bus 393. Imaging device 200 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating systems and methods for generating images using an image sensor pixel array having sub-pixel resolution capabilities.

An image sensor may have an array of photosensitive regions (e.g., photodiodes) arranged in rows and columns and readout circuitry for reading out image signals from the array. The photosensitive regions may sometimes be referred to herein as sub-pixels or photodiodes, may be coupled to shared floating diffusion nodes, and may share common reset transistor, row select transistor, and source follower transistor circuitry (e.g., a given pixel may include multiple photodiodes coupled to a common floating diffusion node, reset transistor, and row-select transistor). The array of photodiodes may include a first group (set) of photodiodes covered with a first color filter element (or set of color filter elements) that is configured to transmit light of a first color (e.g., red, green, or blue) to each photodiode in the first group. The array may include a second group of photodiodes covered with a second color filter element that is configured to transmit light of a second color to each photodiode in the second group. The second color filter element may, if desired, be a broadband color filter element configured to transmit at least two of red light, green light, and blue light. In another suitable arrangement, the second color filter element may be a green color filter element. The array of photodiodes may include additional sets of photodiodes covered with additional color filter elements configured to transmit light of any desired color.

Each photodiode in the first group may be formed at adjacent locations in the array. For example, each photodiode in the first group may be formed in two adjacent (e.g., consecutive) rows and two adjacent columns of the array. Two or more photodiodes in the first group may share a common charge storage node (e.g., floating diffusion node). Each photodiode may be coupled to the shared charge storage node through a respective charge transfer gate. Two or more photodiodes in the second group may share an additional common charge storage node. The first and second groups may each include any desired number of photodiodes (e.g., four photodiodes, eight photodiodes, etc.) and any desired number of the photodiodes in each group may share a common floating diffusion node.

As an example, the first group of photodiodes may include a first charge transfer gate that is configured to transfer a first charge from the first photodiode to the shared charge storage region and a second charge transfer gate configured to transfer a second charge from the second photodiode to the shared charge storage region. The imaging system may include pixel readout circuitry coupled to the array that is operable in a low resolution mode in which the pixel readout circuitry reads out image signals corresponding to a sum of the first and second charges from the shared charge storage region and is operable in a high resolution mode in which the pixel readout circuitry reads out image signals corresponding to a given one of the first and second charges from the shared charge storage region. If desired, dual gain conversion gates may be coupled to the shared charge storage regions, may be turned on when the pixel readout circuitry is in the high resolution mode, and may be turned off when the pixel readout circuitry is in the low resolution mode. Each photodiode in the first and second groups may be provided with a corresponding microlens or multiple photodiodes in the first and second groups may share microlenses.

If desired, the imaging system may be operated in a high-dynamic-range (HDR) imaging mode to generate HDR images by capturing low exposure images using relatively short integration times and capturing high exposure images using relatively long integration times. As an example, a first pair of photodiodes in the first group may be configured to generate a first charge during a short integration time, whereas a second pair of photodiodes configured to generate a second charge during a long integration time. The first pair of photodiodes may be formed diagonally opposite to one another and may be adjacent to the second pair of photodiodes, which may also be formed diagonally opposite to one another.

If desired, the photodiodes in different rows and columns of the array may begin integrating charge at different times and the captured charge may be read out row by row from the array. For example, a first photosensitive region located in the first row and the first column and a second photosensitive region located in the first row and the third column may begin charge integration at a first time, whereas a third photosensitive region located in the first row and the second column and a fourth photosensitive region located in the first row and the fourth column may begin charge integration at a second time after the first time. The pixel readout circuitry may read out first image signals corresponding to charge generated by the first, second, third, and fourth image photodiodes (e.g., photodiodes in the first row) at a first readout time. If desired, a fifth photosensitive region located in the third row and the first column and a sixth photosensitive region located in the third row and the third column may begin charge integration at the first time, and a seventh photosensitive region located in the third row and the second column and an eighth photosensitive region located in the third row and the fourth column may begin charge integration at the second time. The pixel readout circuitry may read out second image signals corresponding to charge generated by the fifth, sixth, seventh, and eighth photosensitive regions (e.g., photodiodes in the third row) at a second readout time that is after the first readout time. If desired, a ninth photosensitive region located in the second row and the first column and a tenth photosensitive region located in the second row and the third column may begin charge integration at a third time that is after the first time and before the second time. The pixel readout circuitry may read out third image signals corresponding to charge generated by the ninth and tenth photosensitive regions (e.g., photodiodes in the second row) at a third readout time that is after the first readout time and before the second readout time.

If desired, the imaging system may further include a central processing unit, memory, input-output circuitry, and a lens that focuses light onto the array of image sensor pixels.

The foregoing is merely illustrative of the principles of this invention and various modifications can be made by those skilled in the art without departing from the scope and spirit of the invention. The foregoing embodiments may be implemented individually or in any combination.

What is claimed is:

1. An imaging system, comprising:
   an array of photodiodes arranged in rows and columns, wherein the array comprises a first group of photodiodes and a second group of photodiodes, first and second consecutive rows, and first and second consecutive columns, wherein the first group of photodiodes comprises a first photodiode located in the first row and first column, a second photodiode located in the first row and second column, a third photodiode located in the second row and first column, and a fourth photodiode located in the second row and second column;
   a first color filter element formed over the first group of photodiodes, wherein the first color filter element is configured to pass light of a first color to each photodiode of the first group;
   a second color filter element formed over the second group of photodiodes, wherein the second color filter element is configured to pass light of a second color that is different than the first color to each photodiode of the second group;
   a shared charge storage region coupled to the first group of photodiodes, wherein the first, second, third, and fourth photodiodes are coupled to the shared charge storage region through respective first, second, third, and fourth charge transfer gates;
   an additional charge storage region coupled to the shared charge storage region through a dual gain conversion gate, wherein the dual gain conversion gate is directly coupled to the first transfer gate, the second transfer gate, and the shared charge storage region;
   a first microlens formed directly over the first and second photodiodes, wherein the first and second photodiodes are configured to generate a first charge during a first integration time; and
   a second microlens formed directly over the third and fourth photodiodes, wherein the third and fourth photodiodes are configured to generate a second charge during a second integration time that is different from the first integration time.

2. The imaging system defined in claim 1, wherein the first charge transfer gate is configured to transfer a portion of the first charge from the first photodiode to the shared charge storage region and the second charge transfer gate is configured to transfer a portion of the second charge from the third photodiode to the shared charge storage region, the imaging system further comprising:
   readout circuitry coupled to the array, wherein the readout circuitry is operable in a low resolution mode in which the readout circuitry reads out image signals corresponding to a sum of the portions of the first and second charges from the shared charge storage region and in a high resolution mode in which the readout circuitry reads out image signals corresponding to a given one of the portions of the first and second charges from the shared charge storage region.

3. The imaging system defined in claim 2, further comprising:
   control circuitry coupled to the array, wherein the control circuitry is configured to turn on the dual gain conversion gate when the readout circuitry is in the low resolution mode, and wherein the control circuitry is configured to turn off the dual gain conversion gate when the readout circuitry is in the high resolution mode.

4. The imaging system defined in claim 1, further comprising:
   four additional adjacent photodiodes in the array; and
   four respective microlenses each formed directly over a respective one of the four additional adjacent photodiodes in the array.

5. The imaging system defined in claim 1, further comprising:
   four additional adjacent photodiodes in the array; and
   a third microlens that is formed directly over all of the four additional adjacent photodiodes.

6. The imaging system defined in claim 1, wherein the second group of photodiodes comprises fifth, sixth, seventh, and eighth photodiodes, wherein the fifth and sixth photodiodes are configured to generate a third charge during the second integration time, wherein the seventh and eighth photodiodes are configured to generate a fourth charge during the first integration time, wherein the fifth photodiode is located in the first row and a third column in the array, wherein the sixth photodiode is located in the second row and a fourth column in the array, wherein the seventh photodiode is located in the second row and the third column, wherein the eighth photodiode is located in the first row and fourth column, wherein the third column is adjacent to the second column, and wherein the fourth column is adjacent to the third column.

7. The imaging system defined in claim 6, wherein the array further comprises:
- a third group of photodiodes; and
- a third color filter element formed over the third group of photodiodes, wherein the third color filter element is configured to pass light of the second color to each photodiode of the third group, wherein the third group of photodiodes comprises ninth, tenth, eleventh, and twelfth photodiodes, wherein the ninth and tenth photodiodes are configured to generate a fifth charge during the first integration time, wherein the eleventh and twelfth photodiodes are configured to generate a sixth charge during the second integration time, wherein the ninth photodiode is located in a third row and the third column of the array, wherein the tenth photodiode is located in a fourth row and the fourth column of the array, wherein the eleventh photodiode is located in the third row and the fourth column, wherein the twelfth photodiode is located in the fourth row and third column, wherein the third row is adjacent to the second row, and wherein the fourth row is adjacent to the third row.

8. The imaging system defined in claim 1, wherein the first color filter element is configured to light selected from the group consisting of: red light, green light, and blue light.

9. The imaging system defined in claim 1, wherein the second group of photodiodes is located in third and fourth consecutive rows and the first and second columns of the array, wherein the third row is adjacent to the second row, wherein the first group of photodiodes is configured to output first image signals over a first column output line, and wherein the second group of photodiodes is configured to simultaneously output second image signals over a second column output line that is different from the first column output line.

10. The imaging system defined in claim 1, further comprising:
- four additional adjacent photodiodes in the array;
- a microlens formed directly over a first pair of the four additional adjacent photodiodes, wherein a second pair of the four additional adjacent photodiodes are formed without any corresponding microlenses.

11. A method of operating an imaging system having readout circuitry an array of photosensitive regions arranged in rows and columns, wherein the array comprises first, second, third, and fourth consecutive rows and first, second, third, and fourth consecutive columns of photosensitive regions, the method comprising:
- with a first photosensitive region located in the first row and the first column and a second photosensitive region located in the first row and the third column, beginning charge integration at a first time;
- with a third photosensitive region located in the first row and the second column and a fourth photosensitive region located in the first row and the fourth column, beginning charge integration at a second time, wherein the second time is different from the first time;
- with a fifth photosensitive region located in the second row and first column, beginning charge integration at a third time, wherein the third time is different from the first and second times;
- with a sixth photosensitive region located in the second row and second column, beginning charge integration at a fourth time, wherein the fourth time is different from the first, second, and third times and wherein the charge integration of the first, third, fifth, and sixth photosensitive regions is completed substantially simultaneously;
- with the readout circuitry, reading out first image signals corresponding to charge generated by the first, second, third, and fourth image photosensitive regions at a first readout time and reading out second image signals corresponding to charge generated by the fifth and sixth photosensitive regions at a second readout time.

12. The method defined in claim 11, further comprising:
- with a seventh photosensitive region located in the third row and the first column and a eighth photosensitive region located in the third row and the third column, beginning charge integration at the first time;
- with a ninth photosensitive region located in the third row and the second column and a tenth photosensitive region located in the third row and the fourth column, beginning charge integration at the second time; and
- with the readout circuitry, reading out third image signals corresponding to charge generated by the fifth, sixth, seventh, and eighth photosensitive regions at a third readout time.

13. The method defined in claim 12, wherein the array comprises a first color filter element formed over the first, third, fifth, and sixth photosensitive regions and a second color filter element formed over the second and fourth photosensitive regions, the method further comprising:
- with the first color filter element, transmitting light of a first color to the first, third, fifth, and sixth photosensitive regions; and
- with the second color filter element, transmitting light of a second color that is different from the first color to the second and fourth photosensitive regions.

14. An imaging system, comprising:
- an array of photodiodes arranged in rows and columns, wherein the array comprises a first group of photodiodes and a second group of photodiodes, wherein the first group of photodiodes comprises three adjacent photodiodes in the array;
- logic circuitry formed adjacent to the three adjacent photodiodes in the first group of photodiodes, wherein the logic circuitry includes at least one charge transfer gate and a dual conversion gain gate, and wherein the at least one charge transfer gate is directly coupled to the at least one dual conversion gain gate;
- a first color filter element formed directly over the first group of photodiodes and the logic circuitry, wherein the first color filter element is configured to pass light of a first color to each photodiode of the first group; and
- a second color filter element formed over the second group of photodiodes, wherein the second color filter element is configured to pass light of a second color that is different than the first color to each photodiode of the second group.

15. The imaging system defined in claim 14, wherein the at least one charge transfer gate is configured to transfer charge generated by at least one of the three adjacent photodiodes to a shared charge storage region and wherein the shared charge storage region is directly coupled to the dual conversion gain gate.

16. The imaging system defined in claim 15, wherein the logic circuitry comprises a source follower directly coupled to the shared charge storage region.

* * * * *